(12) United States Patent
Yu et al.

(10) Patent No.: US 10,872,542 B2
(45) Date of Patent: Dec. 22, 2020

(54) STEREOSCOPIC DISPLAY PANEL, STEREOSCOPIC DISPLAY DEVICE AND STEREOSCOPIC DISPLAY METHOD

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Jie Yu, Beijing (CN); Dae Keun Yoon, Beijing (CN); Qing Ma, Beijing (CN); Yangbing Yu, Beijing (CN); Qin Tan, Beijing (CN); Pai Sun, Beijing (CN); Pengtao Li, Beijing (CN); Tingfeng Huang, Beijing (CN); Yaoyao Wang, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/338,623

(22) PCT Filed: Sep. 3, 2018

(86) PCT No.: PCT/CN2018/103734
§ 371 (c)(1),
(2) Date: Apr. 1, 2019

(87) PCT Pub. No.: WO2019/052356
PCT Pub. Date: Mar. 21, 2019

(65) Prior Publication Data
US 2019/0228685 A1  Jul. 25, 2019

(30) Foreign Application Priority Data
Sep. 14, 2017  (CN) .......................... 2017 1 0826008

(51) Int. Cl.
*G09G 5/00*     (2006.01)
*G09F 9/30*     (2006.01)
(Continued)

(52) U.S. Cl.
CPC ............. *G09F 9/301* (2013.01); *G02B 30/00* (2020.01); *G02F 1/133305* (2013.01);
(Continued)

(58) Field of Classification Search
CPC ... G02B 30/00; G02B 30/54; G02F 1/133305; G02F 1/133603; G09F 19/14;
(Continued)

(56) References Cited

U.S. PATENT DOCUMENTS

2016/0179277 A1*  6/2016  Kim ..................... G06F 3/044
                                                    345/174
2017/0229062 A1*  8/2017  Zeng ..................... G06F 3/041

FOREIGN PATENT DOCUMENTS

CN      102023393 A      4/2011
CN      203325977 U      12/2013
(Continued)

OTHER PUBLICATIONS

PCT International Search Report, Application No. PCT/CN2018/103734, dated Dec. 10, 2018, 6 pages: with English translation.
(Continued)

*Primary Examiner* — Insa Sadio
(74) *Attorney, Agent, or Firm* — Armstrong Teasdale LLP

(57) ABSTRACT

The present disclosure provides a stereoscopic display panel, a stereoscopic display device, and a stereoscopic display method. The stereoscopic display panel includes a flexible self-luminous display thin film, and a depth-adjustment controllable drive board located below the flexible self-luminous display thin film, which is configured to be capable of adjusting respective depths of different parts
(Continued)

thereof, thereby adjusting the depths of corresponding parts of the flexible self-luminous display thin film to implement a stereoscopic display.

14 Claims, 3 Drawing Sheets

(51) Int. Cl.
    *H01L 27/32*     (2006.01)
    *G02F 1/1333*     (2006.01)
    *H01L 51/00*     (2006.01)
    *G02F 1/13357*     (2006.01)
    *G02B 30/00*     (2020.01)
    *G09F 19/14*     (2006.01)

(52) U.S. Cl.
    CPC .... *G02F 1/133603* (2013.01); *H01L 27/3225* (2013.01); *H01L 51/0097* (2013.01); *G09F 19/14* (2013.01)

(58) Field of Classification Search
    CPC . G09F 9/301; H01L 27/3225; H01L 27/3293; H01L 51/0097; H04N 13/395
    See application file for complete search history.

(56) References Cited

FOREIGN PATENT DOCUMENTS

| | | |
|---|---|---|
| CN | 104781778 A | 7/2015 |
| CN | 104834104 A | 8/2015 |
| CN | 105116559 A | 12/2015 |
| CN | 105700159 A | 6/2016 |
| CN | 205376012 U | 7/2016 |
| CN | 105892971 A | 8/2016 |
| CN | 107490873 A | 12/2017 |
| EP | 2743906 A1 | 6/2014 |
| JP | 2013195536 A | 9/2013 |

OTHER PUBLICATIONS

PCT Written Opinion, Application No. PCT/CN2018/103734, dated Dec. 10, 2018, 5 pages.: with English translation of relevant part.
China First Office Action, Application No. 201710826008.7, dated Mar. 4, 2019, 23 pps.: with English translation.

\* cited by examiner

STEREOSCOPIC DISPLAY PANEL, STEREOSCOPIC DISPLAY DEVICE AND STEREOSCOPIC DISPLAY METHOD

CROSS REFERENCE TO RELATED APPLICATIONS

This patent application is a National Stage Entry of PCT/CN2018/103734 filed on Sep. 3, 2018, which claims the benefit and priority of Chinese Patent Application No. 201710826008.7 filed on Sep. 14, 2017, the disclosures of which are incorporated by reference herein in their entirety as part of the present application.

BACKGROUND

The present disclosure relates to the field of stereoscopic display technologies, and in particular, to a stereoscopic display panel, a stereoscopic display device, and a stereoscopic display method.

Current stereoscopic display technology is divided into glasses type and naked-eye type. The glasses type can be divided into a polarization type, a shutter type, a color cast type, and a split-screen type. The commonly used implementations of the naked-eye type are a grating type, a cylindrical lens type, and a directing backlight type.

A conventional grating type naked-eye stereoscopic display panel includes a self-illuminating OLED display panel and an LCD panel without a color resist layer, the LCD panel being located on a display side of the OLED. When operating in 3D display mode, the LCD panel is used as a grating; when operating in 2D display mode, the OLED panel is used as a backlight.

However, current implementations of stereoscopic display each have their inadequacies, for example, loss of resolution, loss of color and brightness caused by the way of generating stereoscopic image perception through the visual difference, user's feeling of dizziness when viewing for a long time, and the rise in costs.

BRIEF DESCRIPTION

One aspect of the present disclosure provides a stereoscopic display panel. The stereoscopic display panel includes a flexible self-luminous display thin film, and a depth-adjustment controllable drive board located below the flexible self-luminous display thin film 110, which is configured to be capable of adjusting respective depths of different parts thereof, thereby adjusting the depths of corresponding parts of the flexible self-luminous display thin film to implement a stereoscopic display.

Another aspect of the present disclosure provides a stereoscopic display device. The stereoscopic display device includes a stereoscopic display panel according to any one of the embodiments of the present disclosure, and an image processor configured to be capable of sending a depth signal to the depth-adjustment controllable drive board of the stereoscopic display panel to adjust depths of different parts of the depth-adjustment controllable drive board.

Another aspect of the present disclosure provides a stereoscopic display method. The stereoscopic display method includes adjusting, by a depth-adjustment controllable drive board located below a flexible self-luminous display thin film, respective depths of different parts of the depth-adjustment controllable drive board, so as to adjust a depth of a corresponding part of the flexible self-luminous display thin film, and displaying an image by the flexible self-luminous display thin film.

DETAILED DESCRIPTION

The stereoscopic display technical solution provided by the specific embodiments of the present disclosure will be further described in detail below in conjunction with the accompanying drawings in order to better understand the solution of the present disclosure. It is apparent that the described and illustrated embodiments and the various specific features thereof are merely illustrative description of the present disclosure and are not intended to limit the disclosure. Based on the illustrative description, all other embodiments and specific features thereof obtained by those skilled in the art without departing from the scope of the disclosure belong to the scope of the disclosure.

Figure 1:
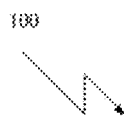
FIG. 1 illustrates a stereoscopic display panel in accordance with an embodiment of the present disclosure.
Figure 1:
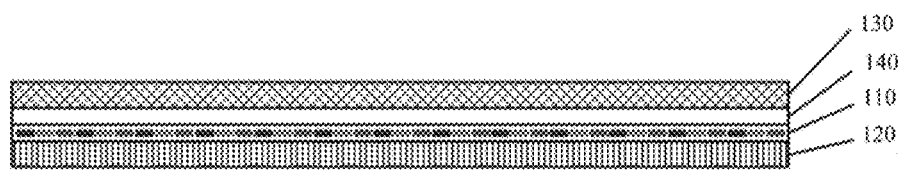

Referring now to FIG. 1, a stereoscopic display panel 100 in accordance with an embodiment of the present disclosure is illustrated. As shown in FIG. 1, the stereoscopic display panel 100 includes a flexible self-luminous display thin film 110, and a depth-adjustment controllable drive board 120 located below the flexible self-luminous display thin film 110, which is configured to be capable of adjusting respective depths of different parts thereof, thereby adjusting the depths of the corresponding parts of the flexible self-luminous display thin film 110 to implement stereoscopic display.

Since the depths of the corresponding parts of the flexible self-luminous display thin film 110 can be adjusted by adjusting respective depths of different parts of the depth-adjustment controllable drive board 120, the different parts of the image displayed by the flexible self-luminous display thin film 110 can protrude or be recessed to different depths. For example, the portion of the image positioned in the foreground protrudes, and the portion of the image positioned in the background is recessed, so that a stereoscopic effect can be achieved, such as an effect similar to the effect of the relief. Moreover, since such stereoscopic display does not rely on the visual difference between the left and right eyes to generate stereoscopic perception, there is less loss of resolution, color, and brightness, and there is no feeling of dizziness when viewed for a long time, and the cost is low.

The flexible self-luminous display thin film 110, as the name suggests, is a flexible and self-luminous display thin film, that is, the display thin film is bendable or partially deformable, and can display images in a self-luminous manner (i.e., without using a backlight). The flexible self-luminous display thin film 110 may receive an image signal from an image processor and display a corresponding image based on the image signal. In some embodiments, the flexible self-luminous display thin film can be a flexible OLED display thin film. The flexible OLED display thin film can be fabricated, for example, by evaporating and packaging an OLED device on a thin film substrate. Of course, in other embodiments, the flexible self-luminous display thin film can be any other type of flexible self-luminous display thin film.

The depth-adjustment controllable drive board 120 is located below the flexible self-luminous display thin film 110. The depth-adjustment controllable drive board 120 and the flexible self-luminous display thin film 110 may be closely abutted against each other, such that when adjusting the depths of different parts of the depth-adjustment controllable drive board 120, the depths of the corresponding parts of the flexible self-luminous display thin film 110 may be adjusted accordingly. In the present application, the depth refers to the depth of the flexible self-luminous display thin film 110 or the depth-adjustment controllable drive board 120 in a direction perpendicular to the display plane and with respect to the observer of the display plane. That is, the depth of a certain part of the display thin film indicates the extent to which the part is recessed toward the inside of the stereoscopic display panel 100, and if the degree of the recess is greater, the depth is larger. Alternatively, the depth of a certain part of the display thin film may also inversely indicate the extent to which the part protrudes toward the outside of the stereoscopic display panel 100, and if the degree of protrusion is greater, the depth is smaller (which may also be referred to as the height being higher).

In some embodiments, the flexible self-luminous display thin film 110 is integrated with the depth-adjustment controllable drive board 120. For example, such integration can be accomplished by directly evaporating the OLED device onto the driver board 120 within vacuum and packaging the obtained structure.

Returning to FIG. 1, in some embodiments, the stereoscopic display panel further includes a cover plate 130, wherein the flexible self-luminous display thin film 110 is located below the cover plate 130 and a gap 140 is located therebetween. The gap 140 is used for a change in depth of the flexible self-luminous display thin film. The cover plate 130 is, for example, a transparent cover plate, thereby allowing a user to view an image displayed by the flexible self-luminous display thin film 110.

In some embodiments, the depth-adjustment controllable drive board 120 includes an array of drive blocks, wherein the depth of each drive block can be independently adjusted. The drive blocks may, for example, have the same or different sizes and may cover the entire surface or a portion of the surface of the depth-adjustment controllable drive board 120. Since the depth of each drive block can be independently adjusted, independent adjustment to the depth of different parts of the depth-adjustment controllable drive board 120 can be realized, so that different portions of the image displayed by the flexible self-luminous display thin film 110 have different depths, thus achieving stereoscopic effect.

In some embodiments, each drive block has a size that is a multiple of a pixel size of the flexible self-luminous display thin film, for example, one or more times. In this way, the boundaries of each drive block can be aligned with boundaries of one or more pixel, enabling display driving and depth driving of the complete pixels.

Figure 2:
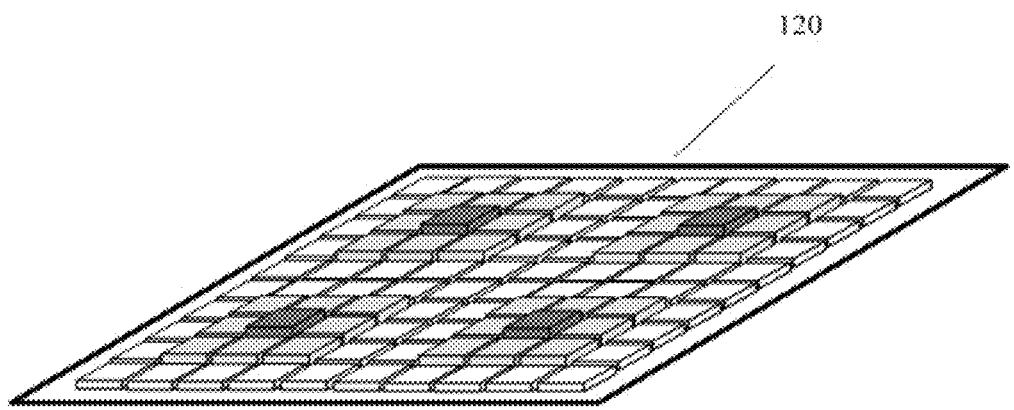
FIG. 2 illustrates a perspective view of a depth-adjustment controllable drive board in accordance with an embodiment of the present disclosure.
Figure 3:
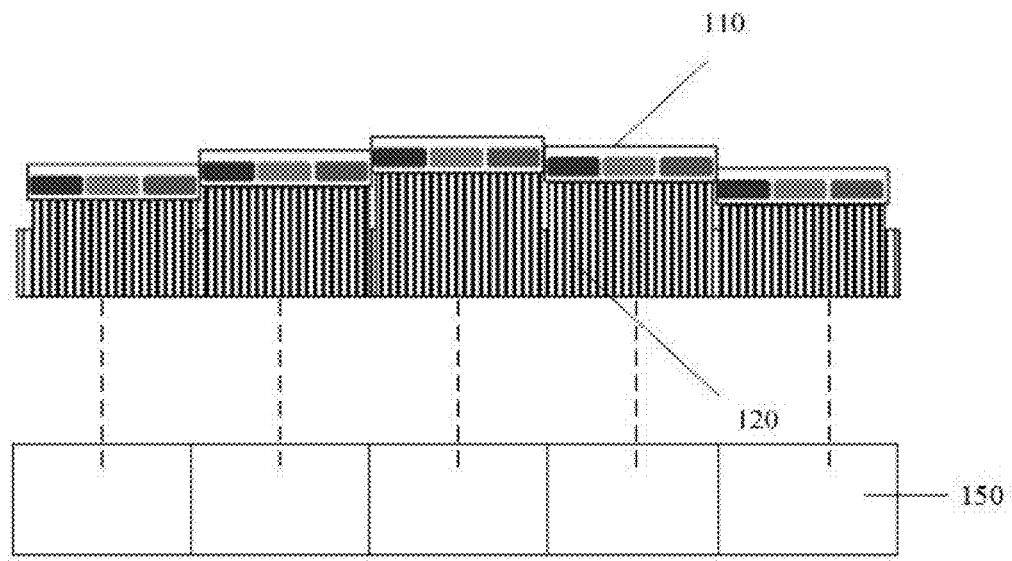
FIG. 3 illustrates a side view of a depth-adjustment controllable drive board in accordance with an embodiment of the present disclosure.

FIG. 2 illustrates a perspective view of a depth-adjustment controllable drive board 120 in accordance with an embodiment of the present disclosure. FIG. 3 illustrates a side view of a depth-adjustment controllable drive board 120 in accordance with an embodiment of the present disclosure. As shown in FIGS. 2 and 3, the depth-adjustment controllable drive board 120 includes an array of drive blocks, wherein the surface shape of each drive block may be square or rectangular, and the depth of each drive block can be independently adjusted, thereby enabling different parts of the entire display surface of the flexible self-luminous thin film 110 located above the drive blocks having different depths, and thus achieving stereoscopic effect.

In some embodiments, the depth-adjustment controllable drive board 120 further includes a drive unit 150 located on a side of each drive block that faces away from the flexible self-luminous display thin film 110. Each drive block corresponds to one drive unit 150 that is configured to be capable of adjusting the depth of the drive block. As shown in FIG. 3, for example, the drive unit 150 corresponding to each drive block may be located below the drive block and may adjust the depth of the drive block by one of multiple mechanisms including mechanical, electrical, magnetic, material, etc. based on the received depth signal about the drive block.

In some embodiments, each drive block includes an electrostrictive material, and the corresponding drive unit 150 is configured to generate a corresponding current or voltage with a corresponding magnitude based on the received depth signal, thereby causing the electrostrictive material of the drive block to have a corresponding depth change. The electrostrictive material can be any material that is capable of mechanically deforming under the action of current, voltage or electric field. Of course, in other embodiments, the drive block may include other materials that can cause mechanical deformation, such as magnetostrictive materials, etc. The drive unit can be any electronic device capable of generating a corresponding current or voltage based on the received depth signal, such as an electronic device similar to an OLED switch or a TFT switch.

The depth signal can be generated, for example, from the received image data by an image processor and sent to the drive unit of each drive block, to adjust the depth of each drive block. The image processor can generate an image display signal based on the image data and send the image display signal to the flexible self-luminous display thin film for image display, simultaneously. In this way, the displayed image will have different depths at different parts, thereby achieving stereoscopic display effect.

The stereoscopic display panel 100 and the depth-adjustment controllable drive board 120 therein in accordance with an embodiment of the present disclosure have been described above with reference to the accompanying drawings, and it is to be noted that, the above illustration and description are only examples, and are not a limit to the present disclosure. In other embodiments of the present disclosure, the stereoscopic display panel 100 and its depth-adjustment controllable drive board 120 may have more, fewer, or different components, and the relationship of positions, connections, and functions between the components may be different from what is described and illustrated. For example, the stereoscopic display panel 100 may further include other layers required to implement its display function, and the other layers may be the same as or different from those in the prior art, and details are not described herein again.

Figure 4:
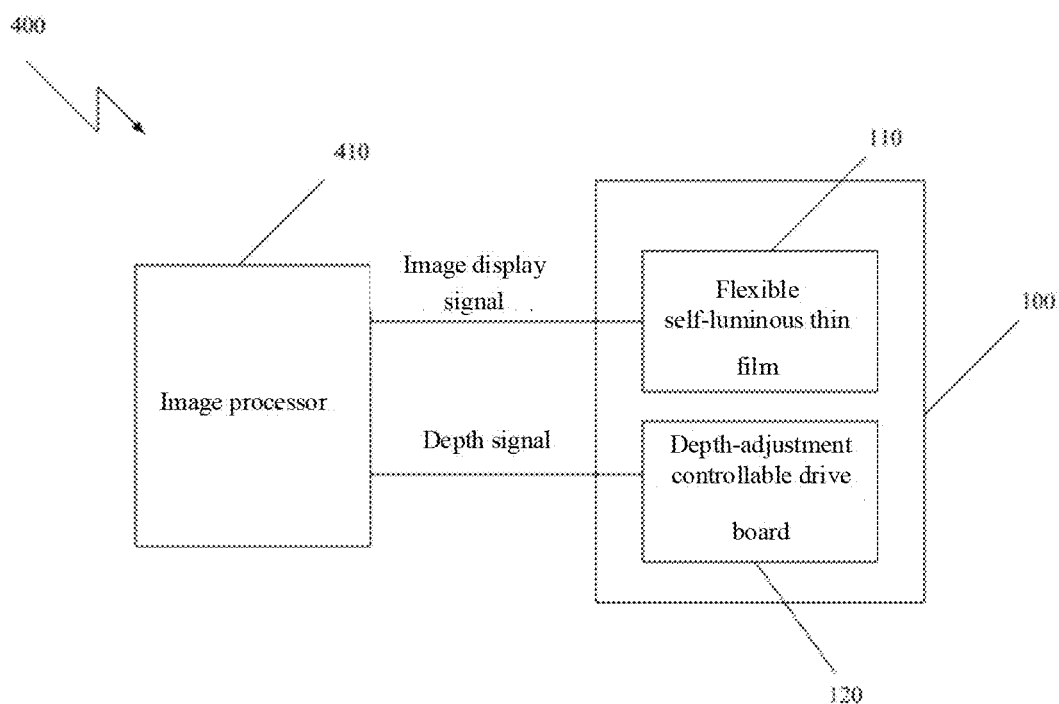
FIG. 4 illustrates a stereoscopic display device in accordance with an embodiment of the present disclosure.

Referring now to FIG. 4, a stereoscopic display device 400 is illustrated in accordance with an embodiment of the present disclosure. As shown in FIG. 4, the stereoscopic display device 400 includes a stereoscopic display panel 100 according to any one of the embodiments of the present disclosure, and an image processor 410 configured to be capable of sending a depth signal to the depth-adjustment controllable drive board 120 of the stereoscopic display panel 100 to adjust the depths of different parts of the depth-adjustment controllable drive board 120.

Specifically, in some embodiments, the image processor 410 is further configured to be capable of sending, respectively, depth signals to drive units of different drive blocks of the depth-adjustment controllable drive board 120, so as to adjust respective depths of different drive blocks.

In some embodiments, the image processor 410 is further configured to acquire information of a depth of field at a position of each pixel in the received image data, generate a depth signal at the position of each pixel based on the information of depth of field, and sent the depth signal at the position of each pixel to the drive unit of the corresponding drive block of the depth-adjustment controllable drive board 120. If the image data received by the image processor 410 is 3D image data, the information of the depth of field at a position of each pixel is already included in the image data, so that the image processor 410 can generate a depth signal at the position of each pixel directly based on the information of the depth of field at the position of each pixel obtained from the image data, and send the depth signal to the drive unit of the drive block corresponding to the position of each pixel. If the image data received by the image processor 410 is 2D image data, the image processor 410 may first identify and process the image data to obtain information of depths of field at positions of each object and each pixel, and then generate a depth signal at the position of each pixel based on the information of the depth of field and send the depth signal to the drive unit of the drive block corresponding to the position of each pixel.

The image processor 410 may generate a depth signal at the position of each pixel from the information of depth of field based on various mapping relationships between the depth of field and depth. In some embodiments, generating the depth signal at the position of each pixel based on the information of the depth of field includes generating the depth signal representing a depth which decreases with increase of proximity between the information of the depth of field and a foreground. That is, the depth, indicated by the depth signal generated for the pixel closer to the foreground in the image, is smaller, so that the drive block is driven forward (from the perspective of viewer) by the corresponding drive unit receiving the information of the depth of field. On the other hand, the depth, indicated by the depth signal generated for the pixel closer to the background in the image, is larger, so that the drive block is driven backward by the corresponding drive unit receiving the drive information, thereby achieving correct and stereoscopic effect.

More specifically, by way of example only, the mapping relationship between the depth of field and the depth may be an equal-ratio linear mapping relationship. For example, assuming that a range that the depth of the drive block can be adjusted within is 20 mm and the controllable precision is 0.01 mm, a maximum achievable gradient is 2000. After receiving the image data, the image processor 410 may generate a depth signal indicating a depth of 0 mm for each pixel of the foremost object in the image, and generate a depth signal indicating a depth of 20 mm for each pixel of the rearmost object in the image. For each pixel of an object between the foremost object and the rearmost object in the image, firstly, the depth of field between the foremost object and the rearmost object may be divided into 2000 equal divisions, and then based on which position of the object is located among the 2000 equal divisions of the depth of field, that position of the object is proportionally mapped to the corresponding depth information within the range of about 0 mm-20 mm. Or, for some images with large parameters of the depth of field, mapping can be made according to some non-linear relationship (such as exponential relationship), and so on.

In some embodiments, the image processor 410 is further configured to generate an image display signal based on the received image data and send the image display signal to the flexible self-luminous display thin film 110 of the stereoscopic display panel. The image processor 410 may, for example, receive image data from an image receiving component, and may send image data to the flexible self-luminous display thin film through an image sending component. The image receiving component and the image sending component may be separate components located outside the image processor 410 or components within the image processor 410. The image data may be from an image acquisition device, a computing device, a storage device, a network, or the like. The image processor 410 may also perform other processing required for displaying on the received image, and the processing may be the same as or different from the processing in the prior art, and details are not described herein again.

The stereoscopic display device 400 in accordance with an embodiment of the present disclosure has been described above with reference to the accompanying drawings, and it is to be noted that, the above illustration and description are merely illustrative and not restrictive. In other embodiments of the disclosure, the stereoscopic display device 400 may have more, fewer, or different components, and the relationship of position, connection, and function between components may be different than that described and illustrated. For example, a plurality of functions performed by one component can also be performed by several different components. For example, the function of sending the depth signal to the drive unit of the corresponding drive block of the depth-adjustment controllable drive board can also be performed by a separate microcontroller. The microcontroller can be signally coupled to the image processor 410 and receive depth signal from the image processor 410, which is generated at the position of each pixel based on the information of the depth of field in the image data. In addition, it should be noted that the names of the components in the present application are merely for convenience of description, and are not intended to limit the present disclosure.

Figure 5:
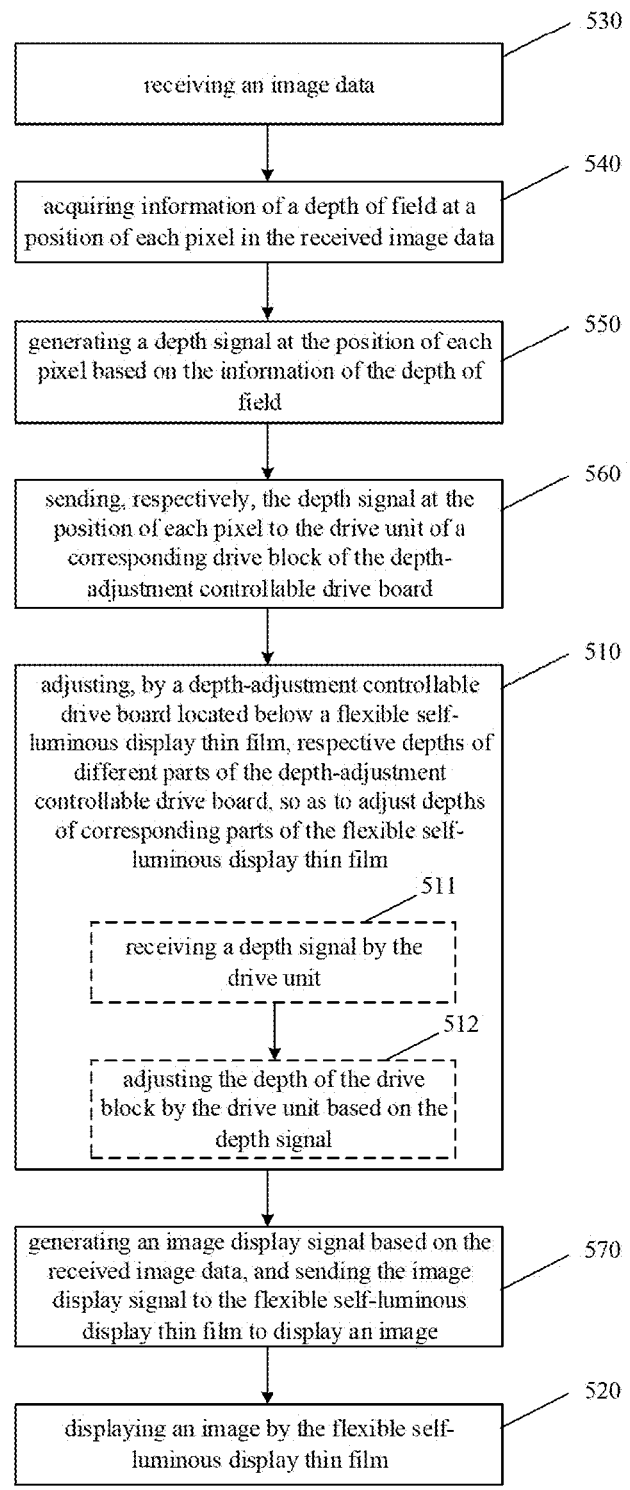
FIG. 5 illustrates a stereoscopic display method in accordance with an embodiment of the present disclosure.

Referring now to FIG. 5, a stereoscopic display method in accordance with an embodiment of the present disclosure is illustrated. The stereoscopic display method can be performed by the stereoscopic display device 400 described above in accordance with an embodiment of the present disclosure. For the sake of brevity, details of the components similar to the above description are omitted in the following description. Accordingly, a more detailed understanding of the stereoscopic display device 400 in accordance with an embodiment of the present disclosure can be obtained with reference to the above description.

As shown in FIG. 5, a stereoscopic display method in accordance with an embodiment of the present disclosure includes the following steps.

At step 510, respective depths of different parts of a depth-adjustment controllable drive board is adjusted, by the depth-adjustment controllable drive board located below a flexible self-luminous display thin film, so as to adjust depths of corresponding parts of the flexible self-luminous display thin film.

At step 520, an image is displayed by the flexible self-luminous display thin film.

In some embodiments, the depth-adjustment controllable drive board includes an array of drive blocks, and wherein the depths of the different parts of the depth-adjustment controllable drive board is adjusted by adjusting respective depth of each drive block.

In some embodiments, each drive block corresponds to a drive unit, and adjusting the depth of different parts of the depth-adjustment controllable drive board by adjusting respective depth of each drive block includes the following optional sub-steps.

At step 511, a depth signal is received by the drive unit.

At step 512, the depth of the drive block is adjusted by the drive unit based on the depth signal.

In some embodiments, the stereoscopic display method further includes the following optional steps.

At step 530, an image data is received.

At step 540, information of a depth of field at a position of each pixel in the received image data is acquired.

At step 550, a depth signal at the position of each pixel is generated based on the information of the depth of field.

At step 560, the depth signal at the position of each pixel are sent, respectively, to the drive unit of corresponding drive block of the depth-adjustment controllable drive board.

In some embodiments, generating the depth signal at the position of each pixel based on the information of the depth of field includes generating the depth signal representing a depth which decreases with increase of proximity between the information of the depth of field and a foreground.

In some embodiments, the stereoscopic display method further includes the following optional steps.

At step 570, an image display signal is generated based on the received image data, and the image display signal is sent to the flexible self-luminous display thin film to display an image.

The stereoscopic display method in accordance with an embodiment of the present disclosure has been described above with reference to the accompanying drawings, and it is to be noted that the above illustration and description are merely illustrative and not restrictive. In other embodiments of the disclosure, the stereoscopic display method may have more, fewer or different steps, and the relationships of order, inclusion and function between the steps may be different from those described and illustrated. For example, typically, multiple steps can be combined into a single larger step; a single step performing multiple operations can also be split into multiple separate steps. For example, the order of the steps in the above description and the drawings does not necessarily represent the actual order of execution between the steps.

It is to be understood that the above-described embodiments of the present disclosure are merely exemplary embodiments employed to explain the principles of the present disclosure, and the present disclosure is not limited thereto. Various modifications and improvements can be made by those skilled in the art without departing from the spirit and scope of the disclosure, and such modifications and improvements are also considered to be within the scope of the present disclosure. The scope of the disclosure is to be limited only by the meaning of the language of the appended claims and their equivalents.

What is claimed is:

1. A stereoscopic display panel comprising:
a flexible self-luminous display thin film; and
a depth-adjustment controllable drive board located below the flexible self-luminous display thin film, the drive board configured to be capable of adjusting respective depths of different parts of the drive board, thereby adjusting the depths of corresponding parts of the flexible self-luminous display thin film to implement a stereoscopic display,
wherein the depth-adjustment controllable drive board comprises an array of drive blocks, and wherein a depth of each drive block can be independently adjusted, and
wherein the depth-adjustment controllable drive board further comprises a drive unit located on a side of each drive block that faces away from the flexible self-luminous display thin film, and wherein the drive unit is configured to be capable of adjusting the depth of the drive block.

2. The stereoscopic display panel according to claim 1, further comprising a cover plate, wherein the flexible self-luminous display thin film is located below the cover plate and wherein a gap is located therebetween.

3. The stereoscopic display panel according to claim 1, wherein each drive block comprises an electrostrictive material, and wherein a corresponding drive unit is configured to generate one of a corresponding current and voltage with a corresponding magnitude based on a received depth signal, thereby causing the electrostrictive material of the drive block to have a corresponding depth change.

4. The stereoscopic display panel according to claim 1, wherein each drive block has a size that is a multiple of a pixel size of the flexible self-luminous display thin film.

5. The stereoscopic display panel according to claim 1, wherein the flexible self-luminous display thin film is an OLED display thin film, and wherein the flexible self-luminous display thin film is integrated with the depth-adjustment controllable drive board.

6. A stereoscopic display device comprising:
a stereoscopic display panel according to claim 1; and
an image processor configured to be capable of sending a depth signal to a depth-adjustment controllable drive board of the stereoscopic display panel to adjust depths of different parts of the depth-adjustment controllable drive board.

7. The stereoscopic display device according to claim 6, wherein the image processor is further configured to acquire information of a depth of field at a position of each pixel in a received image data, generate a depth signal at the position of each pixel based on the information of the depth of field, and send the depth signal at the position of each pixel to a drive unit of a corresponding drive block of the depth-adjustment controllable drive board.

8. The stereoscopic display device according to claim 7, wherein generating the depth signal at the position of each pixel based on the information of the depth of field comprises:
generating the depth signal representing a depth which decreases with increase of proximity between the information of the depth of field and a foreground.

9. The stereoscopic display device according to claim 6, wherein the image processor is further configured to generate an image display signal based on the received image data and send the image display signal to the flexible self-luminous display thin film of the stereoscopic display panel.

10. A stereoscopic display method comprising:
adjusting, by a depth-adjustment controllable drive board located below a flexible self-luminous display thin film, respective depths of different parts of the depth-adjustment controllable drive board, so as to adjust depths of corresponding parts of the flexible self-luminous display thin film; and displaying an image by the flexible self-luminous display thin film, wherein the depth-adjustment controllable drive board comprises an array of drive blocks, and wherein the respective depths of the different parts of the depth-adjustment controllable drive board are adjusted by adjusting a depth of each drive block, wherein the depth-adjustment controllable drive board further comprises a drive unit located on a side of each drive block that faces away from the flexible self-luminous display thin film, and wherein adjusting the respective depths of the different parts of the depth-adjustment controllable drive board by adjusting the depth of each drive block comprises:

receiving a depth signal by the drive unit; and adjusting the depth of the drive block by the drive unit based on the depth signal.

11. The stereoscopic display method according to claim 10, the method further comprising:

receiving an image data;

acquiring information of a depth of field at a position of each pixel in the received image data;

generating a depth signal at the position of each pixel based on the information of the depth of field; and sending, respectively, the depth signal at the position of each pixel to the drive unit of a corresponding drive block of the depth-adjustment controllable drive board.

12. The stereoscopic display method according to claim 11, wherein generating the depth signal at the position of each pixel based on the information of the depth of field comprises generating the depth signal representing a depth which decreases with increase of proximity between the information of the depth of field and a foreground.

13. The stereoscopic display method according to claim 11, the method further comprising:

generating an image display signal based on the received image data, and sending the image display signal to the flexible self-luminous display thin film to display an image.

14. A stereoscopic display device comprising:

a stereoscopic display panel according to claim 2; and an image processor configured to be capable of sending a depth signal to a depth-adjustment controllable drive board of the stereoscopic display panel to adjust depths of different parts of the depth-adjustment controllable drive board.

* * * * *